(12) United States Patent
Tanaka et al.

(10) Patent No.: US 9,318,532 B2
(45) Date of Patent: Apr. 19, 2016

(54) SEMICONDUCTOR MEMORY DEVICE

(71) Applicant: Kabushiki Kaisha Toshiba, Minato-ku (JP)

(72) Inventors: Chika Tanaka, Yokohama (JP); Masumi Saitoh, Yokkaichi (JP); Kensuke Ota, Kawasaki (JP); Kiwamu Sakuma, Yokkaichi (JP); Daisuke Matsushita, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/574,562

(22) Filed: Dec. 18, 2014

(65) Prior Publication Data

US 2015/0236072 A1 Aug. 20, 2015

(30) Foreign Application Priority Data

Feb. 18, 2014 (JP) ................................ 2014-028196

(51) Int. Cl.
*H01L 47/00* (2006.01)
*H01L 27/24* (2006.01)
*H01L 45/00* (2006.01)

(52) U.S. Cl.
CPC ........ *H01L 27/2436* (2013.01); *H01L 27/2463* (2013.01); *H01L 27/2481* (2013.01); *H01L 45/085* (2013.01); *H01L 45/1233* (2013.01); *H01L 45/1266* (2013.01); *H01L 45/145* (2013.01); *H01L 45/146* (2013.01)

(58) Field of Classification Search
CPC ............ H01L 51/5012; H01L 51/5088; H01L 51/0072; H01L 51/5056; H01L 51/5072
USPC .................................................... 257/2, 4, 5
See application file for complete search history.

(56) References Cited

U.S. PATENT DOCUMENTS

| 2002/0141233 | A1 | 10/2002 | Hosotani et al. | |
| 2009/0201710 | A1* | 8/2009 | Ueda ...................... | G11C 7/062 365/51 |
| 2010/0054017 | A1* | 3/2010 | Maejima ............ | G11C 13/0011 365/148 |
| 2010/0208509 | A1 | 8/2010 | Maejima | |
| 2012/0063224 | A1 | 3/2012 | Edahiro | |
| 2012/0069627 | A1* | 3/2012 | Minemura ............. | G11C 5/063 365/148 |
| 2012/0217461 | A1* | 8/2012 | Kobayashi ............. | H01L 45/08 257/2 |
| 2013/0070507 | A1 | 3/2013 | Yoon | |

FOREIGN PATENT DOCUMENTS

| JP | 2002-299575 | 10/2002 |
| JP | 2010-192718 | 9/2010 |
| JP | 2012-59333 | 3/2012 |
| JP | 2013-65393 | 4/2013 |

* cited by examiner

*Primary Examiner* — Andy Huynh
(74) *Attorney, Agent, or Firm* — Oblon, McClelland, Maier & Neustadt, L.L.P.

(57) ABSTRACT

A semiconductor memory device comprises: a memory cell array comprising first wiring lines, second wiring lines extending crossing the first wiring lines, and memory cells at intersections of the first and second wiring lines, the memory cells being stacked perpendicularly to a substrate, each memory cell comprising a variable resistance element; a first select transistor layer comprising a first select transistor operative to select one of the first wiring lines; a second select transistor layer comprising a second select transistor operative to select one of the second wiring lines; and a peripheral circuit layer on the substrate, the peripheral circuit layer comprising a peripheral circuit that controls a voltage applied to one of the memory cells. The first select transistor layer is provided below the memory cell array perpendicularly to the substrate. The second select transistor layer is provided above the memory cell array perpendicularly to the substrate.

13 Claims, 8 Drawing Sheets

SEMICONDUCTOR MEMORY DEVICE

This application is based on and claims the benefit of priority from prior Japanese Patent Application No. 2014-28196, filed on Feb. 18, 2014, the entire contents of which are incorporated herein by reference.

FIELD

The embodiments described herein relate to a semiconductor memory device.

BACKGROUND

Recently, as a successor to the flash memory, a resistive memory device including a variable resistance element as a memory element has drawn attention. Here, the resistive memory device shall include several kinds of devices including the strictly resistive RAM (ReRAM) and the phase change RAM (PCRAM). The ReRAM includes, as the recording layer, a transition metal oxide and stores its resistance value state in a non-volatile manner. The PCRAM includes, as the recording layer, a material such as chalcogenide and uses the resistance value information of its crystal state (conductor) and amorphous state (insulator).

The resistive memory device comprises a memory cell array. The memory cell array has memory cells disposed at intersections of bit lines and word lines. Each memory cell includes a variable resistance element. The memory cell array may use the characteristics of the variable resistance element to select one of the memory cells. In addition, an alternating stack of the bit lines and the word lines and a three-dimensional array of the memory cells may achieve the high density memory cell array.

The high density memory cell array needs a number of select transistors for selecting the bit lines and the word lines included in the memory cell array. This also increases the region where the select transistors for selecting the bit lines and the word lines are disposed. The entire chip area may thus be increased.

DETAILED DESCRIPTION

A semiconductor memory device according to one embodiment comprises: a memory cell array, the memory cell array comprising a plurality of first wiring lines, a plurality of second wiring lines extending crossing the first wiring lines, and a plurality of memory cells disposed at intersections of the first and second wiring lines, the memory cells being stacked in a direction perpendicular to a substrate, each memory cell comprising a variable resistance element; a first select transistor layer comprising a first select transistor operative to select one of the first wiring lines; a second select transistor layer comprising a second select transistor operative to select one of the second wiring lines; and a peripheral circuit layer provided on the substrate, the peripheral circuit layer comprising a peripheral circuit that controls a voltage applied to one of the memory cells. The first select transistor layer is provided below the memory cell array in a direction perpendicular to the substrate. The second select transistor layer is provided above the memory cell array in a direction perpendicular to the substrate.

Next, with reference to the drawings, the embodiments of the present invention will be described in more detail. Note that in the following description in the drawings of the embodiments, like elements are designated by like reference numerals, and repeated description thereof is omitted here.

[Entire Configuration]

Figure 1:
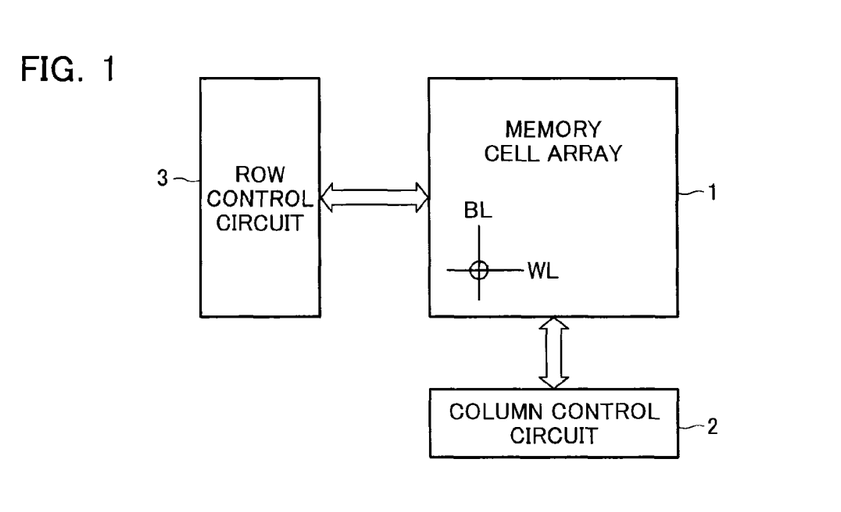
FIG. 1 is a block diagram of a semiconductor memory device according to a first embodiment.

FIG. 1 is a block diagram showing the configuration of a semiconductor memory device according to a first embodiment of the present invention. The semiconductor memory device comprises a non-volatile memory. The non-volatile memory comprises a memory cell array 1. The memory cell array 1 has memory cells disposed in a matrix. Each memory cell comprises a variable resistance element VR described below.

The memory cell array 1 comprises a plurality of bit lines BL. The bit lines BL are electrically connected to a column control circuit 2. The column control circuit 2 controls the voltages of the bit lines BL. The column control circuit 2 selects at least one of the bit lines BL of the memory cell array 1 to perform data erase of the memory cell, data write to the memory cell, and data read from the memory cell. The memory cell array 1 also comprises a plurality of word lines WL. The word lines WL are electrically connected to a row control circuit 3. The row control circuit 3 controls the voltages of the word lines WL. The row control circuit 3 selects at least one of the word lines WL of the memory cell array 1 to perform the data erase of the memory cell, the data write to the memory cell, and the data read from the memory cell.

[Memory Cell Array 1]

Figure 2:
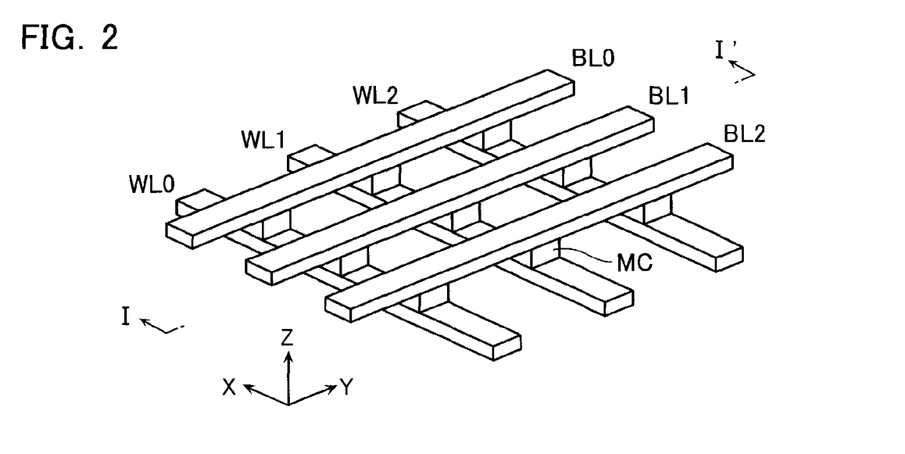
FIG. 2 is a perspective view of a portion of the memory cell array 1 of the semiconductor memory device according to the first embodiment.
Figure 3:
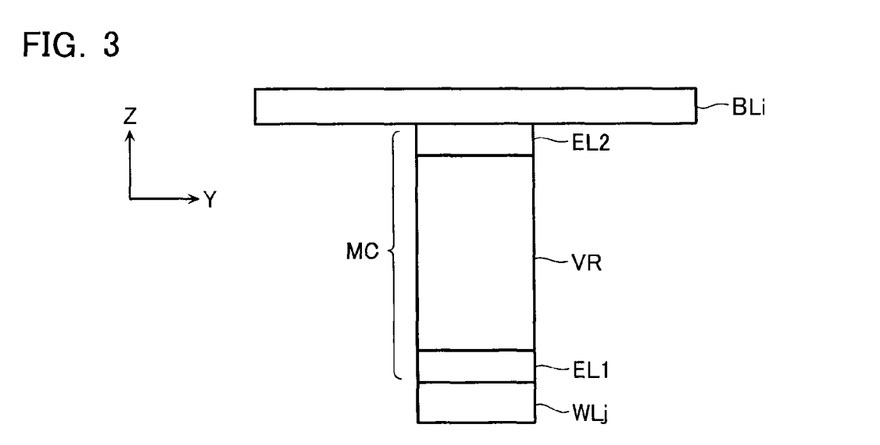
FIG. 3 is a cross-sectional view of one memory cell cut along the I-I' line in FIG. 2 and viewed in the arrow direction.

FIG. 2 is a perspective view of a part of the memory cell array 1. FIG. 3 is a cross-sectional view of one memory cell cut along the I-I' line in FIG. 2 and viewed in the arrow direction. As a plurality of first wiring lines, bit lines BL0 to BL2 are provided in the Y-direction parallel to the surface of a not-shown substrate. As a plurality of second wiring lines crossing the bit lines BL, word lines WL0 to WL2 are provided in the X-direction parallel to the surface of the not-shown substrate. At the intersections of the word lines WL0 to WL2 and the bit lines BL0 to BL2, respective memory cells MC are disposed and sandwiched by both wiring lines. Preferably, the first and second wiring lines comprise a material that has high heat resistance and a low resistance, such as W, WN, WSi, NiSi, CoSi, or the like.

[Memory Cell MC]

With reference to FIG. 3, the memory cell MC is a circuit having a variable resistance element VR connected between one of the bit lines BL and one of the word lines WL. Under and on the variable resistance element VR in the Z-direction, electrodes EL1 and EL2 are disposed, respectively. The electrodes EL1 and EL2 function as a barrier metal and a bonding layer. The variable resistance element VR is disposed on the electrode EL1 and the electrode EL2 is disposed on the variable resistance element VR. The electrode material of the electrode EL2 comprises a metal element that forms a conductive filament. The electrode EL2 comprises a metal element such as, for example, Ag, Ni, Co, Al, Zn, Ti, Ta, and Cu. The metal element ions used in the electrode EL2 move into the variable resistance element VR, thus forming the conductive filament. The electrode EL2 may further comprise a stack of impurity-doped silicon, W, Ti, $TiN_x$, $TiSi_x$, $TiSi_xN_y$, Ta, $TaN_x$, and $TaSi_xN_y$. The electrode EL1 may comprise various metal elements. The electrode EL1 may comprise, for example, impurity-doped silicon, W, Ti, $TiN_x$, $TiSi_x$, $TiSi_xN_y$, Ta, $TaN_x$, $TaSi_xN_y$, and a stacked structure thereof.

[Variable Resistance Element]

The variable resistance element VR may comprise a material that may change, when applied with a voltage, its resistance via an electric field, a current, heat, a chemical energy or the like. The variable resistance element VR comprises, as a substrate, a film comprising silicon oxide ($SiO_x$), for example. Specifically, the variable resistance element VR comprises a single layer film of silicon oxide ($SiO_x$) or a stacked structure of silicon oxide ($SiO_x$) and semiconductor or insulator. The semiconductor and insulator stacked on the silicon oxide ($SiO_x$) comprise silicon (Si) and hafnium oxide ($HfO_x$) or the like. As described below, the variable resistance element VR of this embodiment expresses different current-voltage characteristics with respect to the applied voltage depending on its state. This may be used to utilize the variable resistance element VR as a selection device.

[Memory Cell Array and its Peripheral Circuit]

Figure 4:
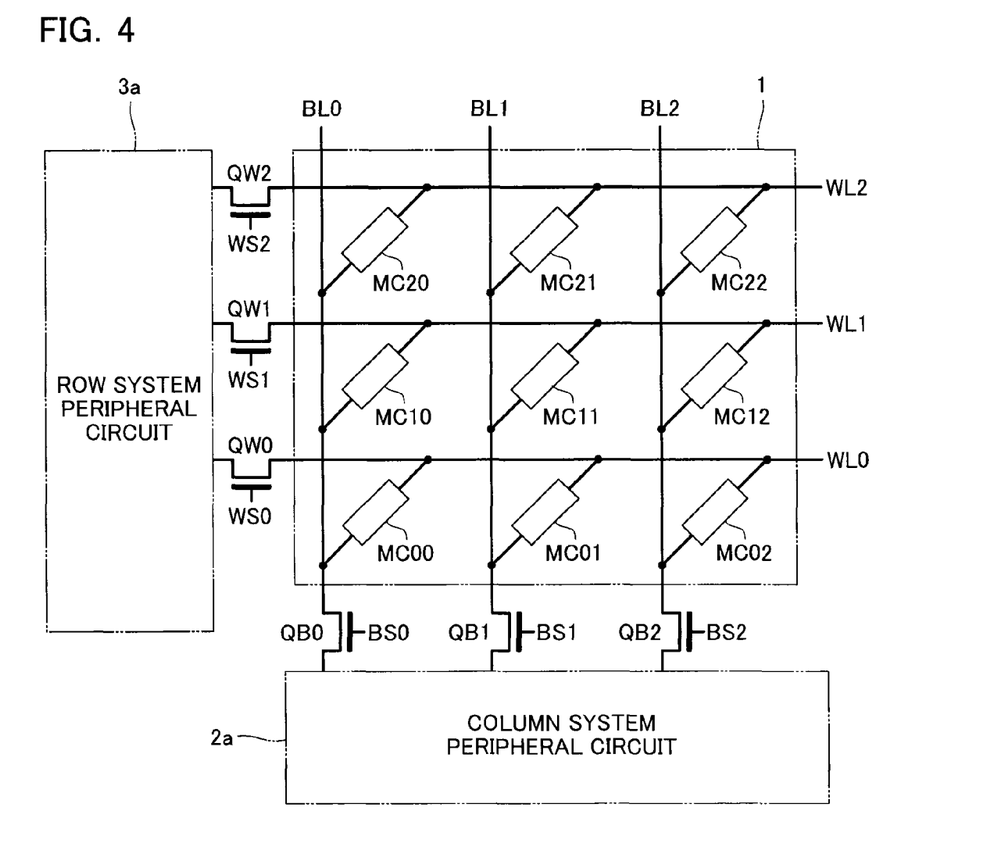
FIG. 4 is a circuit diagram of the memory cell array 1 and its peripheral circuit of the semiconductor memory device according to the first embodiment.

FIG. 4 is a circuit diagram of the memory cell array 1 and its peripheral circuit. Each bit line BL has one end connected to, via a bit line select transistor QBi (i=0 to 2), a column system peripheral circuit 2a, which is a portion of the column control circuit 2. In addition, each word line WL has one end connected to, via a word line select transistor QWi (i=0 to 2), a row system peripheral circuit 3a, which is a portion of the row control circuit 3. The bit line select transistor QBi (i=0 to 2) has a gate electrode supplied with a bit line selection signal BSi (i=0 to 2) to select each bit line BL. The word line select transistor QWi (i=0 to 2) has a gate electrode supplied with a word line selection signal WSi (i=0 to 2) to select each word line WL.

The column system peripheral circuit 2a and the row system peripheral circuit 3a supply voltages necessary for the operations to the bit lines BL and the word lines WL. The column system peripheral circuit 2a and the row system peripheral circuit 3a may be added with different functions necessary for the operation controls of the bit lines BL and word lines WL, respectively.

[Example Stacked Memory Cell Array]

Figure 5:
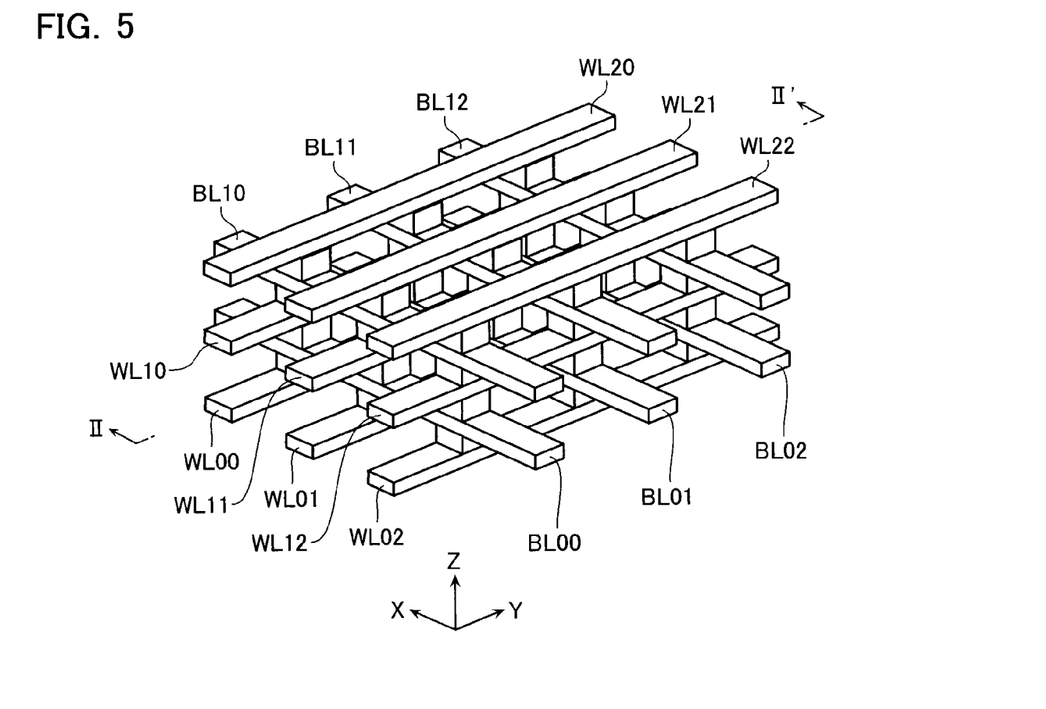
FIG. 5 shows another example configuration of the memory cell array 1 of the semiconductor memory device according to the first embodiment.
Figure 6:
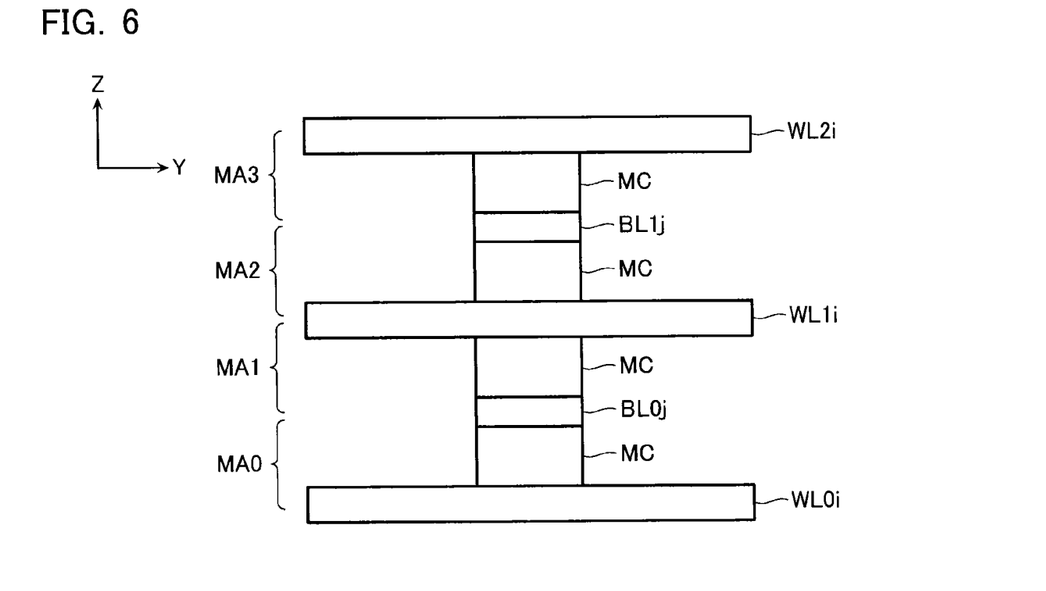
FIG. 6 shows another example configuration of the memory cell array 1 of the semiconductor memory device according to the first embodiment.

In addition, with reference to FIG. 5, a three-dimensional structure may be provided that comprises a stack of more than one memory structure as described above. FIG. 6 is a cross-sectional view showing the II-II' cross-section in FIG. 5. The shown example is a memory cell array of a four layer structure comprising cell array layers MA0 to MA3. A bit line BL0j is shared by memory cells MC1 and MC0 on and under it. A word line WL1i is shared by memory cells MC2 and MC1 on and under it. A bit line BL1j is shared by memory cells MC3 and MC2 on and under it.

In addition, the repetition of the wiring line/cell/wiring line/cell may be replaced with the wiring line/cell/wiring line/interlayer dielectric film/wiring line/cell/wiring line, which has the interlayer dielectric film disposed between the cell array layers. Note that the memory cell array 1 may be divided into some memory cell groups MAT. The above column control circuit 2 and row control circuit 3 may be provided for each memory cell group MAT or for each cell array layer MA or be shared by the memory cell groups MAT or cell array layers MA. In addition, for the purpose of area reduction, more than one bit line BL may share the column control circuit 2 and row control circuit 3.

[Configurations of Stacked Memory Cell Array, Select Transistor Layer, and Peripheral Circuit Layer]

Figure 7:
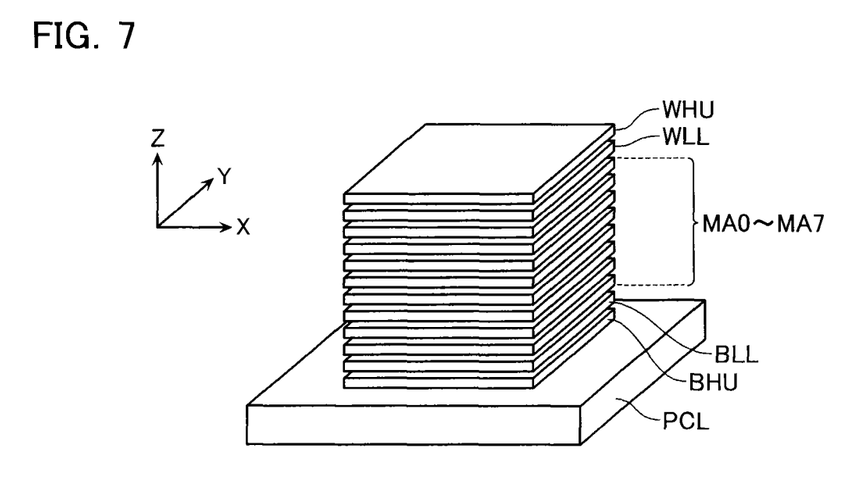
FIG. 7 is a perspective view showing the configuration of a stacked memory cell array, a select transistor layer, and a peripheral circuit layer of the semiconductor memory device according to the first embodiment.

Next, a description is given of the configurations of the stacked memory cell array, a select transistor layer, and the peripheral circuit of the semiconductor memory device according to this embodiment. FIG. 7 is a perspective view showing the configurations of the stacked memory cell array, the select transistor layer, the wiring layer, and the peripheral circuit layer.

Figure 8:
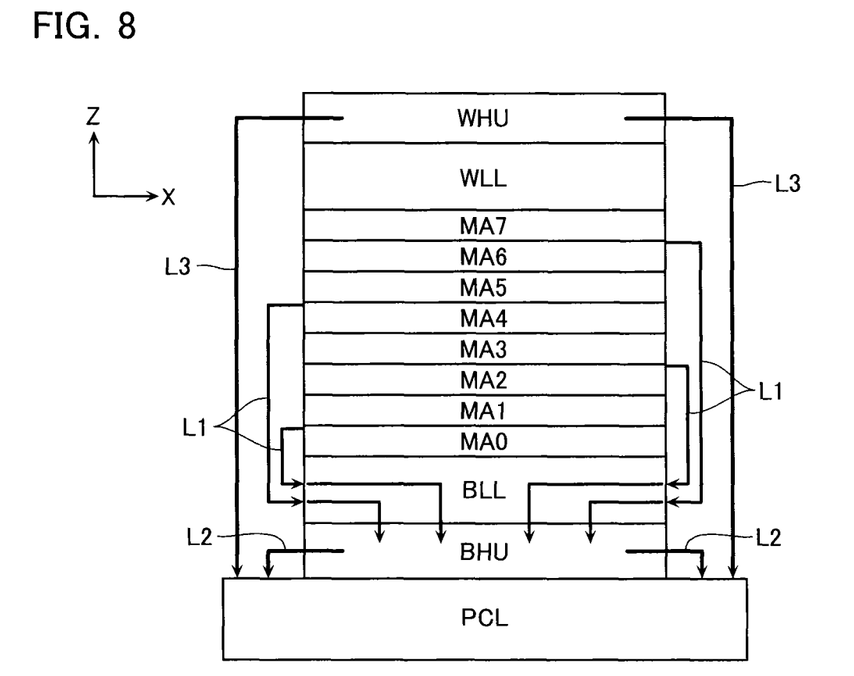
FIG. 8 and FIG. 9 are cross-sectional views showing the configuration of the stacked memory cell array, the select transistor layer, and the peripheral circuit layer of the semiconductor memory device according to the first embodiment.

In this embodiment, it is assumed that the memory cell array 1 is configured as the stacked memory cell array described with reference to FIG. 5 and FIG. 6. With reference to FIG. 7, in this embodiment, eight cell array layers of the cell array layers MA0 to MA7 are provided. Although FIG. 8 shows, for easy understanding, that the cell array layers MA0 to MA7 are separated, the cell array layers MA0 to MA7 are stacked via the bit lines BL or the word lines WL, as described with reference to FIG. 5 and FIG. 6.

Below the cell array layers MA0 to MA7 in the Z-direction, a wiring layer BLL and a bit line select transistor layer BHU having the bit line select transistors QB formed therein are provided. Above the cell array layers MA0 to MA7 in the Z-direction, a wiring layer WLL and a word line select transistor layer WHU having the word line select transistors QW formed therein are provided.

Below the bit line select transistor layer BHU having the bit line select transistors QB formed therein, a peripheral circuit layer PCL is provided. The peripheral circuit layer PCL comprises the column system peripheral circuit 2a and the row system peripheral circuit 3a, which are formed on a semiconductor substrate.

Figure 9:
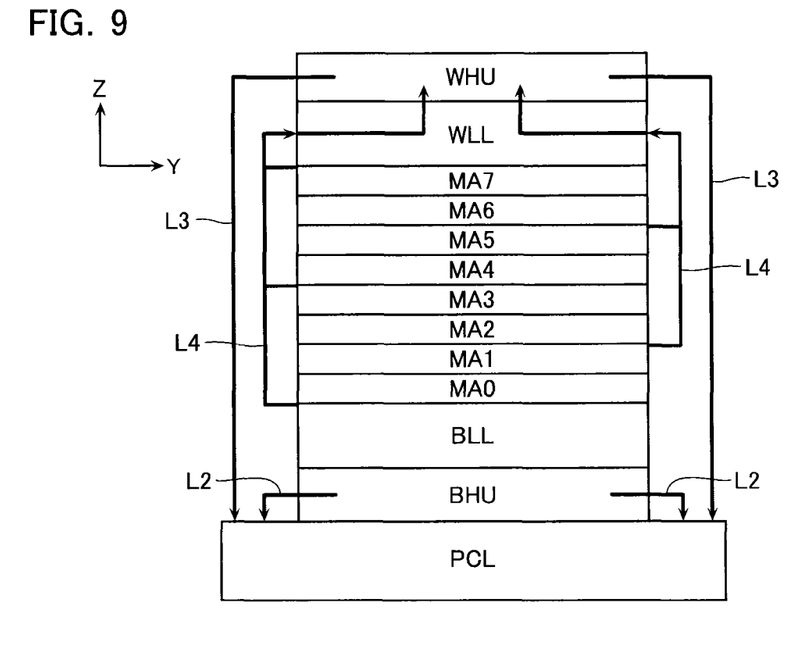

Next, a description is given of a wiring line connecting the stacked memory cell array 1, the select transistor layers BHU and WHU, and the peripheral circuit layer PCL thus configured. FIG. 8 is an X-direction cross-sectional view of the stacked memory cell array 1, the select transistor layers BHU and WHU, and the peripheral circuit layer PCL shown in FIG. 7. FIG. 9 is a Y-direction cross-sectional view of the stacked memory cell array 1, the select transistor layers BHU and WHU, and the peripheral circuit layer PCL shown in FIG. 7.

With reference to FIG. 8, in a cross-section in the X-direction, wiring lines L1 are formed connecting the bit lines BL via the wiring layer BLL to the bit line select transistor layer BHU. The bit lines BL provided in the cell array layers MA are connected to the respective wiring lines L1 provided in the wiring layer BLL. The wiring lines L1 in the wiring layer BLL are connected to the bit line select transistors QB (not shown) provided in the bit line select transistor layer BHU. Ones of the gate electrodes or the drain electrodes (for example, in this embodiment, the drain electrodes) of the bit line select transistors QB provided in the bit line select transistor layer BHU are connected, via wiring lines L2, to the peripheral circuit layer PCL.

In addition, with reference to FIG. 8, in a cross-section in the X-direction, wiring lines L3 are also formed connecting ones of the gate electrodes or the drain electrodes (for example, in this embodiment, the drain electrodes) of the word line select transistors QW (not shown) provided in the word line select transistor layer WHU to the peripheral circuit layer PCL.

With reference to FIG. 9, in a cross-section in the Y-direction, wiring lines L4 are formed connecting the word lines WL via the wiring layer WLL to the word line select transistor layer WHU. The word lines WL provided in the cell array layers MA0, MA3, MA4, and MA7 are commonly connected to one of the wiring lines L4 provided in the wiring layer WLL. In addition, the word lines WL provided in the cell array layers MA1, MA2, MA5, and MA6 are commonly connected to one of the wiring lines L4 provided in the wiring layer WLL. The wiring lines L4 in the wiring layer WLL are connected to the word line select transistors QW (not shown) provided in the word line select transistor layer WHU. One of the gate electrodes or the drain electrodes (for example, in this embodiment, the gate electrodes) of the word line select transistors QW provided in the word line select transistor layer WHU are connected, via the wiring lines L3, to the peripheral circuit layer PCL.

In addition, with reference to FIG. 9, in a cross-section in the Y-direction, the wiring lines L2 are also formed connecting ones of the gate electrodes or the drain electrodes (for example, in this embodiment, the gate electrodes) of the bit line select transistors QB (not shown) provided in the bit line select transistor layer BHU to the peripheral circuit layer PCL.

[Effects]

Figure 10:
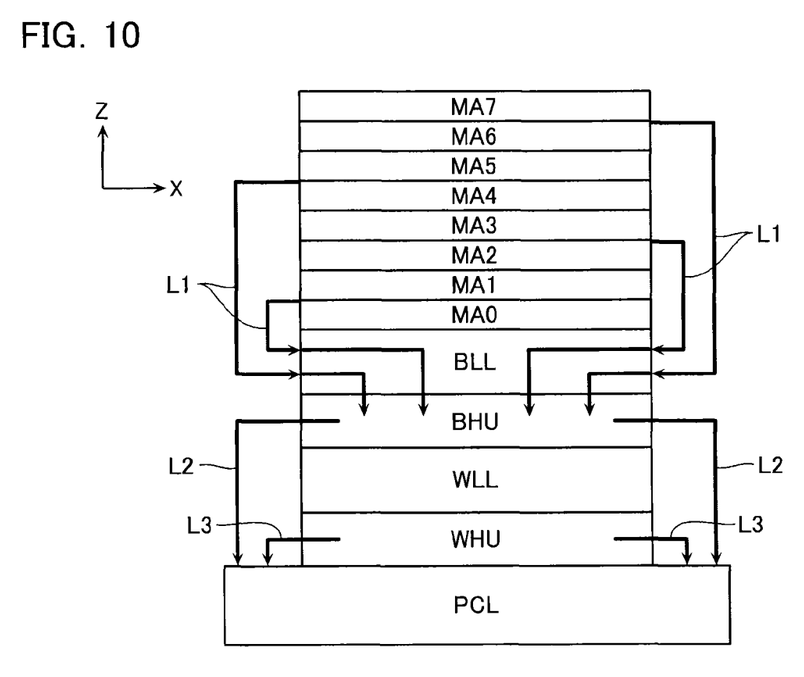
FIG. 10 is a cross-sectional view showing the configuration of a stacked memory cell array, a select transistor layer, and a peripheral circuit layer of a semiconductor memory device according to a comparative example.
Figure 11:
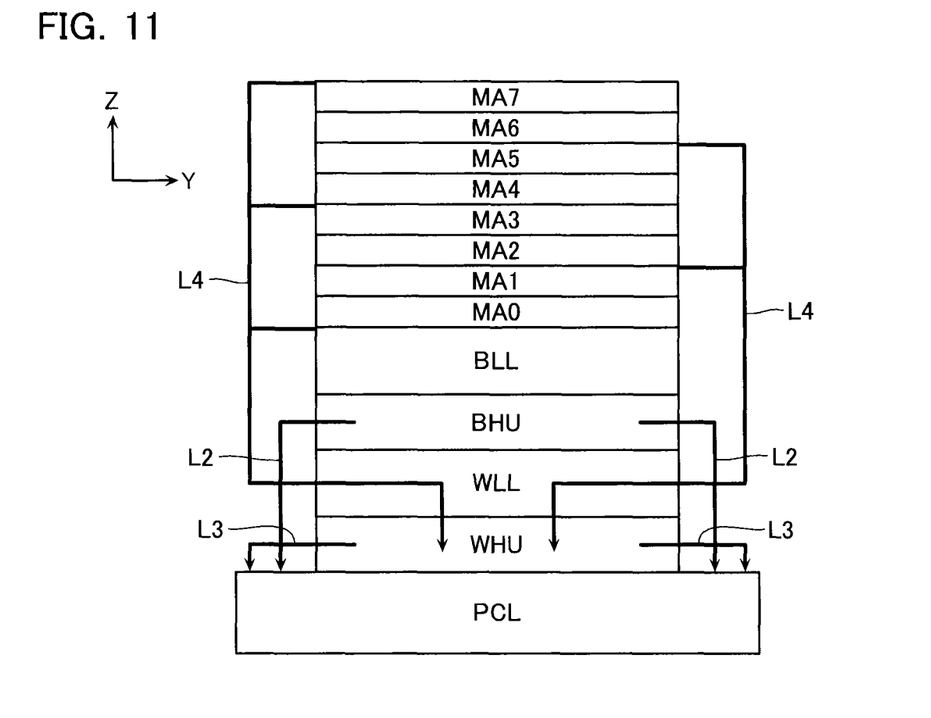
FIG. 11 is a cross-sectional view showing the configuration of the stacked memory cell array, the select transistor layer, and the peripheral circuit layer of the semiconductor memory device according to the comparative example.

A description is given of the effects of the stacked memory cell array, the select transistor layer, and the peripheral circuit layer thus configured according to this embodiment, with reference to a comparative example. FIG. 10 and FIG. 11 are cross-sectional views showing the configurations of a semiconductor memory device according to the comparative example. FIG. 10 and FIG. 11 show cross-sections corresponding to those in FIG. 8 and FIG. 9.

With reference to FIG. 10 and FIG. 11, the semiconductor memory device of the comparative example is different from that in the above embodiment in that the wiring layer WLL and the word line select transistor layer WHU are also provided below the stacked memory cell array in the Z-direction.

If, like the semiconductor memory device of the comparative example, the wiring layer WLL and the word line select transistor layer WHU are also provided below the stacked memory cell array 1 in the Z-direction, the wiring lines L4 connecting the word lines WL to the wiring layer WLL cross the wiring lines L2 connecting the bit line select transistor layer BHU to the peripheral circuit layer PCL (see FIG. 11). In this case, the wiring lines may not be appropriately connected.

Meanwhile, according to the configurations of the stacked memory cell array 1, the select transistor layers BHU and WHU, and the peripheral circuit layer PCL according to this embodiment, the wiring lines L1 to L4 may be connected to the peripheral circuit layer PCL without crossing each other. This configuration may eliminate the necessity to form the bit line select transistors QB or the word line select transistors QW in the peripheral circuit layer PCL, thus reducing the area of the peripheral circuit layer PCL. This may reduce the increase of the chip area of the whole semiconductor memory device.

Second Embodiment

Figure 12:
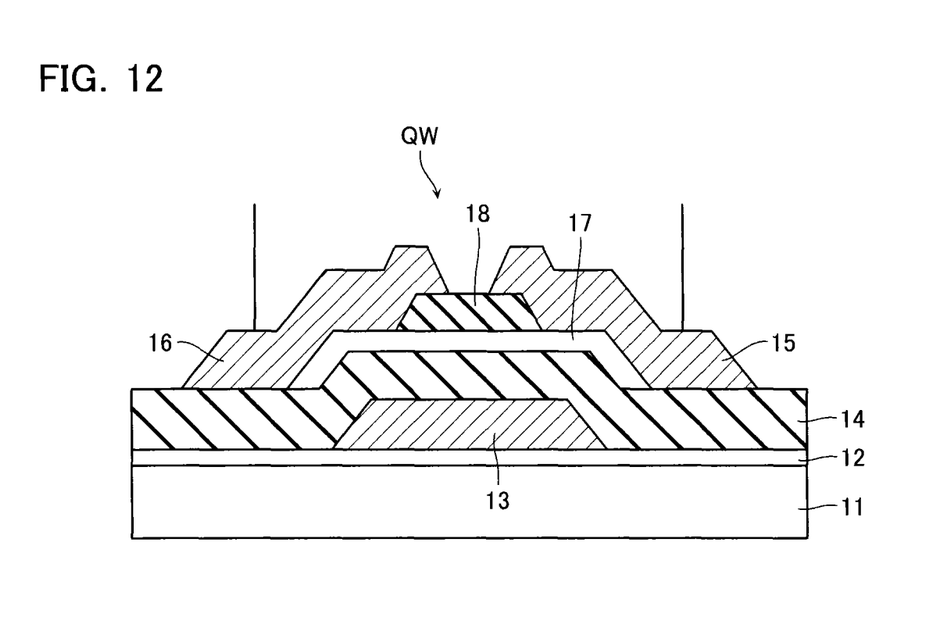
FIG. 12 and FIG. 13 are cross-sectional views showing the configuration of a select transistor of a semiconductor memory device according to a second embodiment.
Figure 13:
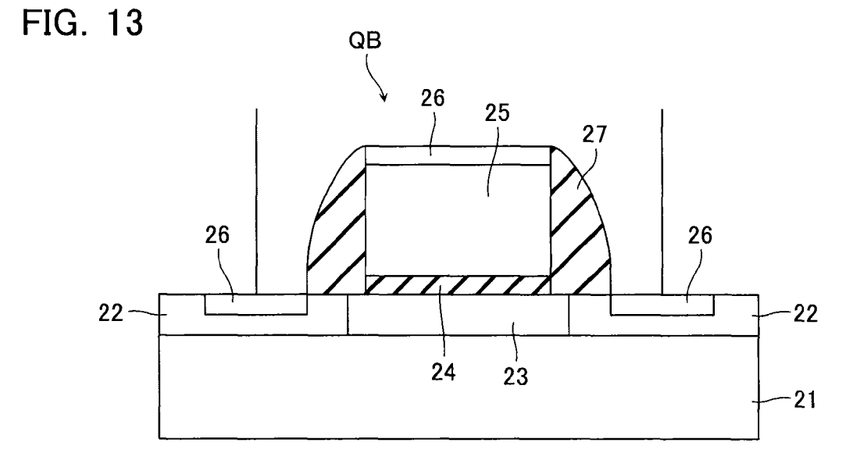

Next, with reference to FIG. 12 and FIG. 13, a second embodiment of the present invention will be described. The entire configuration of a semiconductor memory device according to the second embodiment is similar to that in the first embodiment and thus its detailed description is omitted. In addition, like elements as those in the first embodiment are designated by like reference numerals, and repeated description thereof is omitted here. In the semiconductor memory device according to this embodiment, the bit line select transistor QB and the word line select transistor QW are formed with transistors of different structures. With reference to FIG. 12 and FIG. 13, the configuration of the semiconductor memory device according to this embodiment will be described below.

[Configuration of Select Transistor]

Again, in this embodiment, the word line select transistor layer WHU is provided above the stacked memory cell array 1 and the bit line select transistor layer BHU is provided below the stacked memory cell array 1. The word line select transistors QW and the bit line select transistors QB are formed in the word line select transistor layer WHU and the bit line select transistor layer BHU, respectively. In this embodiment, above and below the stacked memory cell array 1, the word line select transistors QW and the bit line select transistors QB are formed using transistors of different structures.

FIG. 12 is a cross-sectional view showing the configuration of the word line select transistor QW of the semiconductor memory device according to this embodiment. FIG. 13 is a cross-sectional view showing the configuration of the bit line select transistor QB of the semiconductor memory device according to this embodiment.

With reference to FIG. 12, the word line select transistor QW is formed as a back-gate type transistor. With reference to FIG. 12, a glass substrate 11 bears a bottom surface coating 12 for a transistor. The bottom surface coating 12 has a gate electrode 13 formed thereon. The gate electrode 13 is covered by a gate insulating film 14. The gate insulating film 14 comprises, for example, a silicon oxide film. The gate insulating film 14 has a channel region 17 formed thereon. The channel region 17 comprises oxide (InGaZnO) of amorphous indium (In), gallium (Ga), and zinc (Zn). The channel region 17 has source/drain metal layers 15 and 16 formed on both sides thereof. In addition, the channel region 17 has an etching stopper film 18 formed thereon. The etching stopper film 18 is used when the transistor is created. Etching using the etching stopper film 18 separates the source/drain metal layers 15 and 16.

With reference to FIG. 13, the bit line select transistor QB is formed as a normal MOSFET. With reference to FIG. 13, impurities are diffused into a channel region 23 of a silicon substrate 21 to form source/drain diffusion layers 22. Above the channel region 23 between the two adjacent source/drain diffusion layers 22, a gate electrode 25 is formed via a gate insulating film 24 and a side wall insulating film 27. The source/drain diffusion layer 22, the gate insulating film 24, the side wall insulating film 27, and the gate electrode 25 form the bit line select transistor QB. On the top surfaces of the gate electrode 25 and the source/drain diffusion layers 22, a silicide layer 26 is formed for reducing the electrical resistance.

[Effects]

Again, in the semiconductor memory device according to this embodiment, it may not be necessary to form the bit line select transistors QB or the word line select transistors QW in the peripheral circuit layer PCL, thus reducing the area of the peripheral circuit layer PCL. This may reduce the increase of the chip area of the whole semiconductor memory device.

In addition, according to the semiconductor memory device of this embodiment, the word line select transistors QW formed above the stacked memory cell array 1 and the wiring layer WLL are a back-gate transistor. If the normal MOSFETs are formed above the wiring layer WLL, the transistors may experience a substrate bias effect caused by the potential from the wiring layer WLL, which may reduce the driving current. If, however, the word line select transistors QW formed above the wiring layer WLL are a back-gate transistor, the gate electrode 13 resides below the channel region 17 and may reduce the substrate bias effect. The accurate voltage may thus be applied to, via the word line select transistors QW, the word lines WL.

Then, the word line select transistors QW to be formed above the stacked memory cell array 1 and the wiring layer WLL need to be manufactured by a low temperature process not to adversely affect the stacked memory cell array 1 and other configurations. InGaZnO needs a process temperature of about 350° C. that is lower than the process temperature (600° C.) of polysilicon. If the word line select transistors QW are a back-gate transistor using InGaZnO, the word line select transistors QW may be manufactured by a low temperature process. This may reduce the adverse effect to the stacked memory cell array 1 and other configurations in the manufacturing process of the word line select transistors QW.

Some embodiments of the present invention have been described, but these embodiments are shown by way of example and are not intended to limit the scope of the invention. These new embodiments may be implemented in various other forms, and be subjected to various omissions, replacements, and modifications without departing from the spirit of the present invention. These embodiments and variants thereof are within the scope and sprit of the invention, and are also within the scope of the invention as defined in the appended claims and the equivalents thereof.

For example, in the above embodiments, the wiring layer WLL and the word line select transistor layer WHU are formed above the stacked memory cell array 1 in the Z-direction, and the wiring layer BLL and the bit line select transistor layer BHU are formed below the stacked memory cell array 1 in the Z-direction. The wiring layer WLL and the word line select transistor layer WHU may be replaced with the positions of the wiring layer BLL and the bit line select transistor layer BHU with regard to their positional relationship in the vertical direction.

Figure 14:
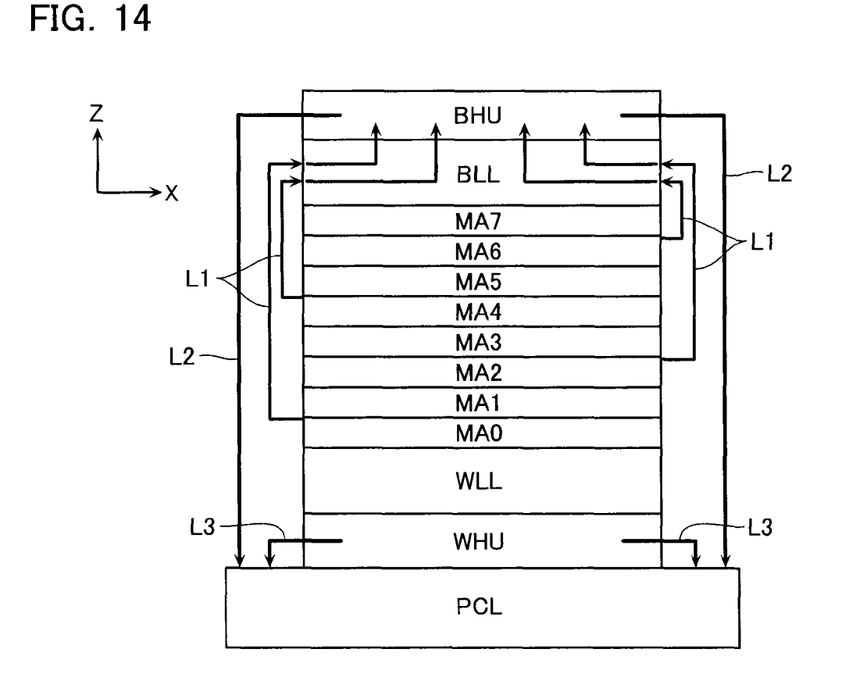
FIG. 14 is a cross-sectional view showing the configuration of a stacked memory cell array, a select transistor layer, and a peripheral circuit layer of a semiconductor memory device according to another example.
Figure 15:
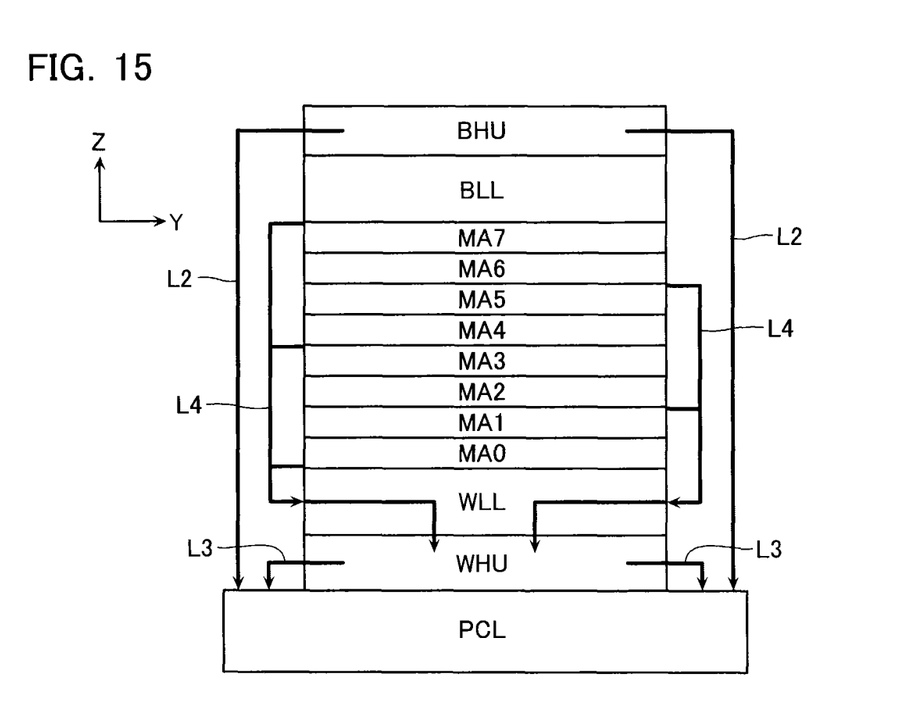
FIG. 15 is a cross-sectional view showing the configuration of a stacked memory cell array, a select transistor layer, and a peripheral circuit layer of a semiconductor memory device according to another example.

FIG. 14 is an X-direction cross-sectional view of the stacked memory cell array 1, the select transistor layers BHU and WHU, and the peripheral circuit layer PCL in another example. FIG. 15 is a Y-direction cross-sectional view of the stacked memory cell array 1, the select transistor layers BHU and WHU, and the peripheral circuit layer PCL in another example.

With reference to FIG. 14 and FIG. 15, above the cell array layers MA0 to MA7 in the Z-direction, the wiring layer BLL and the bit line select transistor layer BHU having the bit line select transistors QB formed therein are provided. Below the cell array layers MA0 to MA7 in the Z-direction, the wiring layer WLL and the word line select transistor layer WHU having the word line select transistors QW formed therein are provided.

In such a configuration, the wiring lines L1 to L4 may be connected to the peripheral circuit layer PCL without crossing each other. This configuration may eliminate the necessity to form the bit line select transistors QB or the word line select transistors QW in the peripheral circuit layer PCL, thus reducing the area of the peripheral circuit layer PCL. This may reduce the increase of the chip area of the whole semiconductor memory device.

What is claimed is:

1. A semiconductor memory device comprising:
    a memory cell array, the memory cell array comprising a plurality of first wiring lines, a plurality of second wiring lines extending crossing the first wiring lines, and a plurality of memory cells disposed at intersections of the first and second wiring lines, the memory cells being stacked in a direction perpendicular to a substrate, each memory cell comprising a variable resistance element;
    a first select transistor layer comprising a first select transistor operative to select one of the first wiring lines;
    a second select transistor layer comprising a second select transistor operative to select one of the second wiring lines; and
    a peripheral circuit layer provided on the substrate, the peripheral circuit layer comprising a peripheral circuit that controls a voltage applied to one of the memory cells,
    the first select transistor layer being provided below the memory cell array in a direction perpendicular to the substrate, and
    the second select transistor layer being provided above the memory cell array in a direction perpendicular to the substrate.

2. The semiconductor memory device according to claim 1, wherein
    the first select transistor and the second select transistor have different structures.

3. The semiconductor memory device according to claim 2, wherein
    the second select transistor comprises a channel region, the channel region comprising InGaZnO.

4. The semiconductor memory device according to claim 1, wherein
    the second select transistor is a back-gate type transistor.

5. The semiconductor memory device according to claim 4, wherein the back-gate type transistor includes:
    a gate electrode provided above the substrate;
    a gate insulating film covering the gate electrode;
    a channel region provided on the gate insulating film; and
    source/drain layers provided on both sides of the channel region.

6. The semiconductor memory device according to claim 4, wherein
the second select transistor comprises a channel region, the channel region comprising InGaZnO.

7. The semiconductor memory device according to claim 1, wherein
the second select transistor comprises a channel region, the channel region comprising InGaZnO.

8. The semiconductor memory device according to claim 7, wherein
the second select transistor is a back-gate type transistor.

9. The semiconductor memory device according to claim 1, further comprising:
a first wiring layer between the memory cell array and the first select transistor layer, the first wiring layer comprising a wiring line connecting one of the first wiring lines and the first select transistor; and
a second wiring layer between the memory cell array and the second select transistor layer, the second wiring layer comprising a wiring line connecting one of the second wiring lines and the second select transistor.

10. The semiconductor memory device according to claim 9, wherein
the first select transistor and the second select transistor have different structures.

11. The semiconductor memory device according to claim 9, wherein
the second select transistor is a back-gate type transistor.

12. The semiconductor memory device according to claim 9, wherein
the second select transistor comprises a channel region, the channel region comprising InGaZnO.

13. The semiconductor memory device according to claim 11, wherein the back-gate type transistor includes:
a gate electrode provided above the substrate;
a gate insulating film covering the gate electrode;
a channel region provided on the gate insulating film; and
source/drain layers provided on both sides of the channel region.

* * * * *